(12) United States Patent
Kodama

(10) Patent No.: US 6,300,843 B1
(45) Date of Patent: Oct. 9, 2001

(54) OSCILLATION CIRCUIT USING COMPARATOR WITH TEMPERATURE COMPENSATED REFERENCE VOLTAGES

(75) Inventor: Hidetaka Kodama, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/394,884

(22) Filed: Sep. 13, 1999

(30) Foreign Application Priority Data

Sep. 11, 1998 (JP) .................................................. 10-258363

(51) Int. Cl.$^7$ ............................. H03K 3/0231; H03L 1/02
(52) U.S. Cl. ............................ 331/111; 331/143; 331/176
(58) Field of Search ..................................... 331/111, 143, 331/176

(56) References Cited

U.S. PATENT DOCUMENTS 3,906,391 * 9/1975 Murdock ............................... 331/143
4,124,827 * 11/1978 Hileman ................................ 331/176
5,912,593 * 6/1999 Susak et al. .......................... 331/143

FOREIGN PATENT DOCUMENTS 8-065046 3/1996 (JP) .

* cited by examiner

*Primary Examiner*—Siegfried H. Grimm

(57) ABSTRACT

An oscillation circuit for outputting an oscillation signal includes a comparison circuit and a reference signal generation circuit. The comparison circuit compares two voltage levels and outputs a comparison result as the oscillation signal. The reference signal generation circuit provides a signal input to the comparison circuit. The reference signal generation circuit includes at least two resistance means coupled with each other in series, where one resistance means is given a smaller regulation of the resistance value relative to the temperature as compared with other resistance means.

11 Claims, 2 Drawing Sheets

OSCILLATION CIRCUIT USING COMPARATOR WITH TEMPERATURE COMPENSATED REFERENCE VOLTAGES

BACKGROUND OF THE INVENTION

1. Field of the Invention

The present invention relates to an oscillation circuit for generating reference clock signals for use in operations of a semiconductor device.

2. Description of the Related Art

Since various functions can be realized by a plurality of integrated circuits, a semiconductor device is used as a microcomputer, microprocessor or the like in various apparatuses. Each circuit incorporated in the semiconductor device operates in response to a reference clock signal. The reference clock signal is generated based on an oscillation signal outputted from an oscillation circuit incorporated in the semiconductor device. Specifically, an output signal from the oscillation circuit is used as the reference clock signal as it is, or the output signal from the oscillation circuit is obtained via an inverter for use as the reference clock signal.

As one oscillation circuit there is a constitution using a comparator. The oscillation circuit constituted using the comparator is disclosed, for example, in a following document: Japanese Patent Application Laid-Open No. 65046/1996.

As disclosed in the document, a signal transmitted to a plus input terminal of a comparator and a signal transmitted to a minus input terminal are compared to output a comparison result as an oscillation signal. Moreover, the signals transmitted to two input terminals of the comparator are both dependent on a resistance element.

Environments where the semiconductor device is operated are various. Therefore, the semiconductor device may be operated under temperatures higher than an ordinary temperature or under temperatures lower than the ordinary temperature.

In the operation under such environment, a frequency of the oscillation signal outputted by the oscillation circuit fluctuates. Specifically, the signal transmitted to the input terminal of the comparator is dependent on the resistance element easily influenced by the temperature, and a resistance value of the resistance element fluctuates by the temperature.

For example, when the output signal of the comparator is fed back to one input terminal of the comparator via the resistance element, the feedback input of the output signal is retarded or accelerated by the fluctuation of the resistance value of the resistance element. On the other hand, a voltage of a reference signal transmitted as a comparison reference to the other input terminal of the comparator is subjected to potential dividing by a plurality of resistance elements. Since the voltage depends on a ratio of the resistance value of a desired resistance element relative to the total of resistance values of the plurality of resistance elements, it hardly fluctuates.

Since the comparator performs a comparison processing by these two input signals, a switch cycle of a voltage level of the output signal (oscillation signal) fluctuates. As a result, the frequency of the reference clock signal fluctuates. The fluctuation of the frequency of the reference clock signal inhibits each circuit from normally operating based on the reference clock signal inside the semiconductor device.

An object of the present invention is to provide an oscillation circuit for following temperature changes to output an oscillation signal of a stable frequency under any temperature.

Moreover, an object of the present invention is to provide an oscillation circuit to realize the above-mentioned object, so that enlargement of a circuit scale and complication of manufacture are minimized.

SUMMARY OF THE INVENTION

To attain the above-mentioned objects, according to the present invention there is provided an oscillation circuit which comprises a comparison circuit for comparing a voltage level of a first input terminal and a voltage level of a reference signal transmitted to a second input terminal to emit an output signal of a voltage level corresponding to a result of the comparison; and a reference signal generation circuit constituted by vertically connecting a plurality of resistance means for outputting a signal subjected to potential dividing by the resistance means as the reference signal. The output signal is fed back to the first input terminal, an oscillation signal is based on the output signal from the comparison circuit, and the plurality of resistance means include resistance means different in a temperature characteristic from other resistance means.

Moreover, the plurality of resistance means include first resistance means having one end to which a power voltage is applied, and the other end connected to a first node; second resistance means having one end to which a ground voltage is applied, and the other end connected to a second node; and third resistance means having one end connected to the first node, and the other end connected to the second node. The reference signal generation circuit may have a selection circuit for selectively outputting as the reference signal a signal generated in the first node and a signal generated in the second node in accordance with the output signal of the comparison circuit.

Moreover, the plurality of resistance means include first resistance means having one end to which the output signal of the comparison circuit is transmitted, and the other end connected to a first node; and second resistance means having one end to which a voltage lower than a power voltage and higher than a ground voltage is applied, and the other end connected to the first node. A signal generated in the first node may be outputted as the reference signal.

Furthermore, each resistance means may be formed using a well layer or an active layer in a semiconductor substrate.

DETAILED DESCRIPTION OF THE PREFERRED EMBODIMENTS

Figure 1:
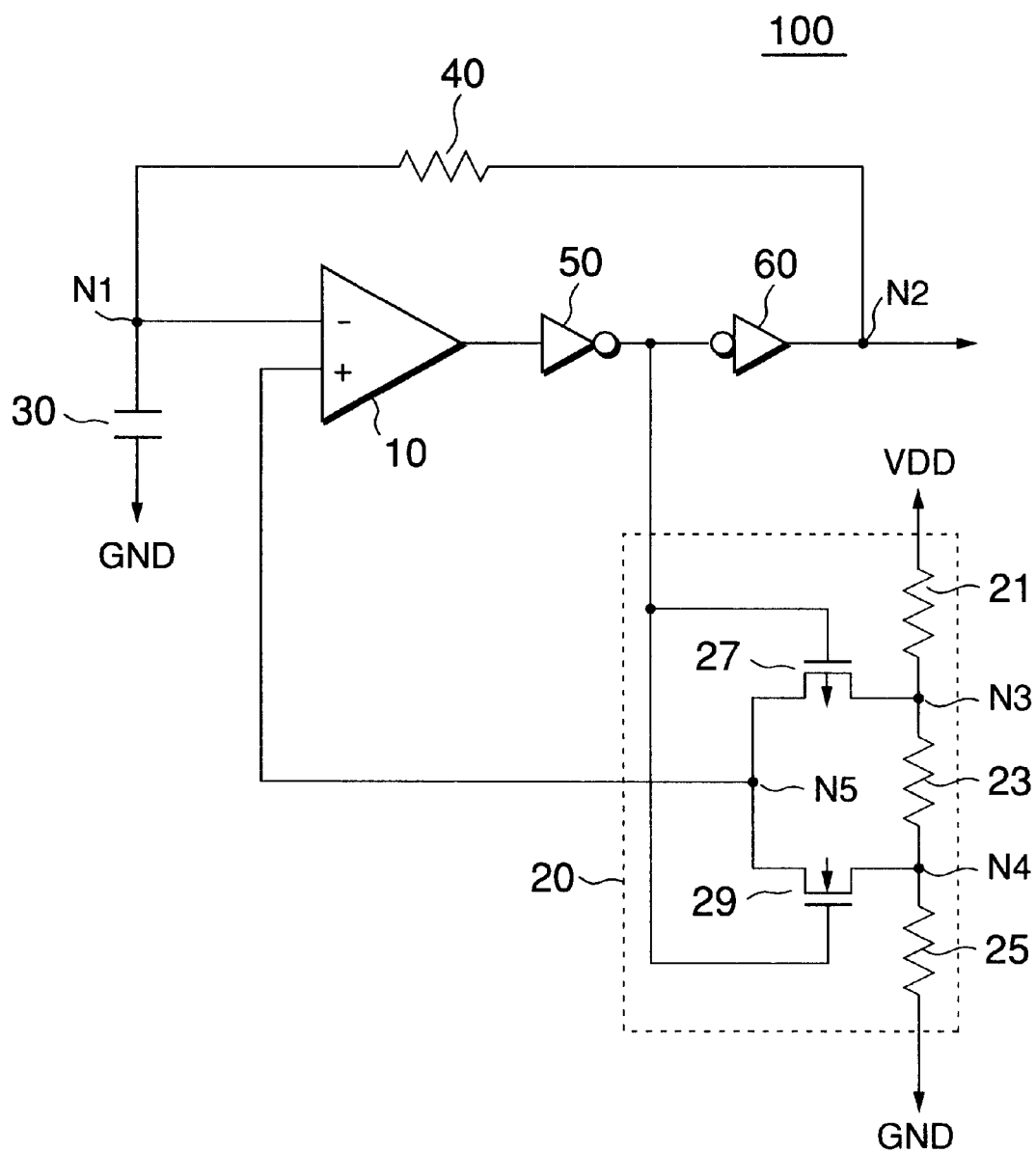
FIG. 1 is a circuit diagram of an oscillation circuit 100 in a first embodiment of the present invention.

An oscillation circuit of the present invention will be described hereinafter in detail with reference to the drawings. FIG. 1 is a circuit diagram of an oscillation circuit 100 in a first embodiment of the present invention. Additionally, the oscillation circuit 100 is incorporated in a semiconductor device.

In FIG. 1, the oscillation circuit 100 is constituted of a comparison circuit or comparator 10, a reference signal generation circuit 20, a capacitor 30, a resistance element 40, and inverters 50, 60.

One input terminal or minus input terminal of the comparator 10 is connected to a node N1. To the other input terminal or plus input terminal of the comparator 10 an output of the reference signal generation circuit 20 or reference signal is transmitted. An output signal of the comparator 10 is transmitted to the inverter 50.

An output signal of the inverter 50 is transmitted to the inverter 60. An output signal of the inverter 60 is transmitted to a node N2. The signal transmitted to the node N2 forms an oscillation signal as an output signal of the oscillation circuit 100. Additionally, the inverters 50, 60 are constituted by vertically connecting N-channel type MOS transistors and P-channel type MOS transistors.

One end of the capacitor 30 is connected to the node N1, and to the other end thereof a ground voltage GND is applied. One end of the resistance element 40 is connected to the node N1, and the other end is connected to the node N2.

The reference signal generation circuit 20, via the inverter 50, changes a voltage level of the reference signal by a signal of a voltage level based on a voltage of the output signal of the comparator 10. A constitution of the reference signal generation circuit 20 will be described later.

The oscillation circuit 100 constituted as described above compares the reference signal transmitted from the reference signal generation circuit 20 and the signal transmitted to the node N1 by the comparator 10. The comparator 10 emits an output signal having a voltage level corresponding to a result of the comparison. The output signal of the comparator 10 is subjected to a waveform shaping by the inverters 50 and 60 and transmitted to the node N2. Particularly, the inverter 50 performs the waveform shaping to exactly control a circuit operation in the reference signal generation circuit 20 described later.

When the signal transmitted to the node N2 is supplied to the node N1 via the resistance element 40, it is fed back to the minus input terminal of the comparator 10. The capacitor 30 charges or discharges electricity based on the signal transmitted to the node N1. The resistance element 40 and the capacitor 30 impart a hysteresis characteristic to the oscillation signal of the oscillation circuit 100.

Here, a circuit constitution of the reference signal generation circuit 20 will be described. As shown in FIG. 1, the reference signal generation circuit 20 is constituted of resistance means or resistance elements 21, 23, 25, and a P-channel type MOS transistor 27 and an N-channel type MOS transistor 29 constituting a selection circuit.

To one end of the resistance element 21 a power voltage VDD is applied, and the other end is connected to a node N3. One end of the resistance element 23 is connected to the node N3, and the other end is connected to a node N4. To one end of the resistance element 25 the ground voltage GND is applied, and the other end is connected to the node N4. Specifically, the resistance elements 21, 23, 25 are vertically connected, and to opposite ends the power voltage VDD and the ground voltage GND are applied. For example, the power voltage VDD is 5V, and the ground voltage GND is 0V.

Therefore, a voltage VH of a signal generated in the node N3, and a voltage VL of a signal generated in the node N4 are subjected to a resistance potential dividing and can be represented in following equations, when a resistance value of the resistance element 21 is R1, a resistance value of the resistance element 23 is R2, and a resistance value of the resistance element 25 is R3:

$$VH = VDD \times \{(R2+R3)/(R1+R2+R3)\} \ldots \quad (1)$$

$$VL = VDD \times \{(R3)/(R1+R2+R3)\} \ldots \quad (2)$$

Additionally, for the resistance element 23, as compared with the resistance elements 21, 25, a regulation of the resistance value relative to the temperature is smaller. For example, the resistance elements 21, 25 are formed in an N-type well layer in a semiconductor substrate in which the oscillation circuit 100 is formed, and the resistance element 23 is formed in a P-type active layer of a high impurity concentration in the semiconductor substrate. Alternatively, the resistance element 21, 25 is formed as MOS resistance using MOS transistor as a resistance, and the resistance element 23 is formed in the P-type active layer of the high impurity concentration in the semiconductor substrate. In this manner, the resistance element 23 is constituted of a material different from that of the resistance element 21, 25, and the resistance element 23 is given a smaller regulation of the resistance value relative to the temperature as compared with the resistance elements 21, 25.

One electrode of the transistor 27 is connected to the node N3, and the other electrode is connected to a node N5. The output signal of the inverter 50 is supplied to a gate electrode of the transistor 27. One electrode of the transistor 29 is connected to the node N4, and the other electrode is connected to the node N5. The output signal of the inverter 50 is supplied to a gate electrode of the transistor 29. A signal generated in the node N5 is transmitted, as the output of the reference signal generation circuit 20 or reference signal, to the plus input terminal of the comparator 10.

Specifically, when the voltage level of the output signal of the inverter 50 is a high voltage level (in the embodiment, a power voltage VDD level, and hereinafter referred to as H level), the transistor 27 is in a non-conductive state, and the transistor 29 is in a conductive state. Therefore, the node N5 corresponds to the voltage level VL of the signal generated in the node N4.

Moreover, when the voltage level of the output signal of the inverter 50 is a low voltage level (in the embodiment, a ground voltage GND level, and hereinafter referred to as L level), the transistor 27 is in the conductive state, and the transistor 29 is in the non-conductive state. Therefore, the node N5 corresponds to the voltage level VH of the signal generated in the node N3.

Figure 2:
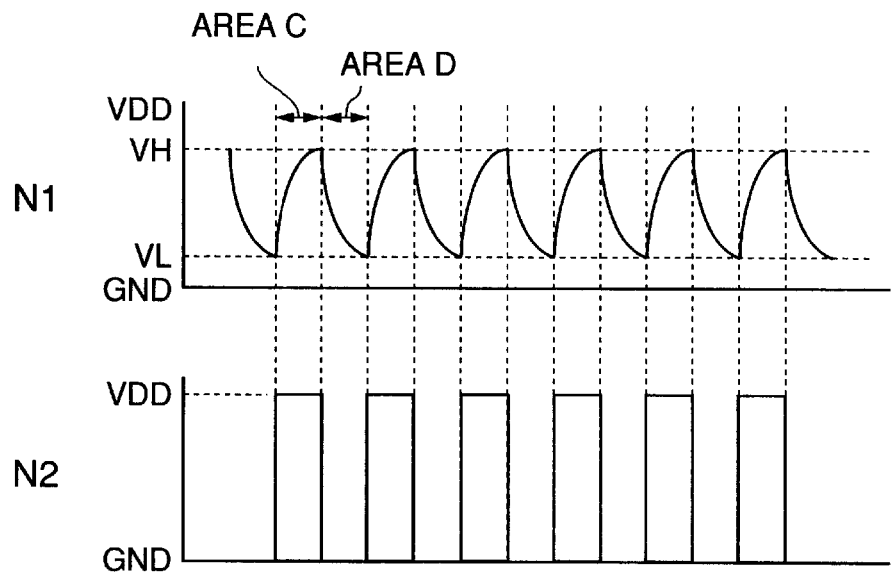
FIG. 2 is an operation waveform diagram showing changes of voltage levels of nodes N1 and N2 in the oscillation circuit 100.

Next, the operation of the oscillation circuit 100 in the first embodiment will be described hereinafter in detail with reference to the drawing. FIG. 2 is an operation waveform diagram showing changes of voltage levels of the nodes N1 and N2 in the oscillation circuit 100.

First, the voltage level of the node N1 is equal to or more than the voltage VL and less than the voltage VH, and the voltage level of the node N2 corresponding to the oscillation signal of the oscillation circuit 100 is H level. In this case, the output signal of the comparator 10 has a voltage corresponding to the H level, and the voltage level of the output signal of the inverter 50 is L level, so that the transistor 27 is in the conductive state. Therefore, the voltage applied to a plus input signal of the comparator 10 is based on the voltage VH.

A signal generated in the node N2 and having a voltage level of H level is transmitted to the node N1 via the resistance element 40. The capacitor 30 is charged based on a signal transmitted to the node N1 and having the voltage level of H level. Therefore, the waveform of the voltage of the node N1 is gradually raised as shown in area C of FIG. 2. The voltage of the node N1 and the voltage VH are compared in the comparator 10.

If the voltage of the node N1 reaches the voltage VH, the comparator 10 detects this, and the voltage level of the output signal of the comparator 10 turns to L level from the H level. With the change in the voltage level of the output signal of the comparator 10, the voltage level of the output signal of the inverter 50 turns to H level, and the voltage level of the output signal of the inverter 60 turns to L level. Therefore, the transistor 27 is in the non-conductive state, the transistor 29 is in the conductive state, and the signal having the voltage level of L level is transmitted to the node N2. Thereby, the voltage applied to the plus input signal of the comparator 10 is based on the voltage VL.

A signal generated in the node N2 and having a voltage level of L level is transmitted to the node N1 via the resistance element 40. Then, electric charges loaded in the capacitor 30 start to be discharged. Therefore, the waveform of the voltage of the node N1 is gradually lowered as shown in area D of FIG. 2. The voltage of the node N1 and the voltage VL are compared in the comparator 10.

If the voltage of the node N1 reaches the voltage VL, the comparator 10 detects this, and the voltage level of the output signal of the comparator 10 turns to H level from L level. With the change in the voltage level of the output signal of the comparator 10, the voltage level of the output signal of the inverter 50 turns to L level, and the voltage level of the output signal of the inverter 60 turns to H level.

Therefore, the transistor 29 is in the non-conductive state, the transistor 27 is in the conductive state, and the signal having the voltage level of H level is transmitted to the node N2. Thereby, the voltage applied to the plus input signal of the comparator 10 is based on the voltage VH.

A signal generated in the node N2 and having the voltage level of H level is transmitted to the node N1 via the resistance element 40. Then, the capacitor 30 starts being charged again. Therefore, the waveform of the voltage of the node N1 becomes as shown in area C of FIG. 2.

Thereafter, the oscillation circuit 100 repeats the above-mentioned operation. Therefore, for the waveform of the voltage of the node N1, N2, the H and L levels are repeatedly generated in predetermined cycles as shown in FIG. 2, so that by outputting the signal of the node N2 as an oscillation signal, the oscillation circuit 100 performs an oscillation operation.

Here, when a capacity of the capacitor 30 is C, and a resistance value of the resistance element 40 is RX, a frequency f of the oscillation signal as an output of the oscillation circuit 100 can be ideally represented in the following equation:

$$f=-[1/[C \times RX \times [\log\{(VDD-VH)/(VDD-VL)\}+\log(VL/VH)]]] \cdots (3)$$

Then, when the equations (1) and (2) are substituted in the equation (3), the following results:

$$f=-[1/[C \times RX \times [\log\{R1/(R1+R2)\}+\log\{R3/(R2+R3)\}]]] \cdots (4)$$

As seen from the equation (4), the frequency of the oscillation signal of the oscillation circuit 100 is not dependent on the power voltage VDD. Therefore, even if the power voltage VDD fluctuates, the oscillation circuit 100 can obtain an oscillation characteristic in which the frequency of the oscillation signal of the oscillation circuit 100 fails to fluctuate. The oscillation circuit 100 can thus provide the 10 oscillation signal of a frequency stable relative to the fluctuation of the power voltage VDD.

Here, the oscillation circuit 100 in which a temperature change occurs will be described. When the temperature of the environment where the oscillation circuit 100 is operated is lower than normal temperature (hereinafter referred to as ordinary temperature), the resistance value of the resistance element 40 is lowered as compared with at the ordinary temperature. If there is no change in the voltage level of the voltage VL, VH, the signal of the node N2 reaches the node N1 early. Therefore, the equation (3) shows that the frequency of the oscillation signal of the oscillation circuit 100 is increased. In this case, the oscillation cycle of the oscillation signal is accelerated.

Here, with the drop of the temperature, the resistance values R1, R2, R3 of the resistance elements 21, 23, 25 are also lowered. As described above, as compared with the resistance elements 21, 25, the resistance element 23 has a smaller regulation of the resistance value relative to the temperature. Therefore, as compared with the decrease ratio of the resistance values R1, R3 of the resistance elements 21, 25, the decrease ratio of the resistance value R2 of the resistance element 23 is smaller. As a result, as seen from the equations (1) and (2), since the decrease of the resistance value R2 is suppressed, the voltage VH becomes higher and the voltage VL becomes lower, as compared with at the ordinary temperature, by a value based on a difference between the regulation of the resistance values for the resistance elements 21, 25 and the regulation of the resistance value for the resistance element 23.

As described above, with the decrease of the resistance value of the resistance element 40, the signal of the node N2 reaches the node N1 early. In this case, by increasing the voltage VH and decreasing the voltage VL, which are compared with the voltage of the node N1 by the comparator 10, the change in the voltage level of the output signal of the comparator 10 can be retarded. Therefore, even if the temperature lowers below the ordinary temperature, the change in the voltage level of the output signal of the comparator 10 is regulated in the same cycle as at the ordinary temperature. Therefore, since the frequency of the oscillation signal of the oscillation circuit 100 fails to be raised, the oscillation cycle of the oscillation signal can be stabilized.

Subsequently, when the temperature becomes higher than the ordinary temperature, the resistance value of the resistance element 40 becomes higher as compared with at the ordinary temperature. If there is no change in the voltage level of the voltage VL, VH, the signal of the node N2 reaches the node N1 late. Therefore, the equation (3) shows that the frequency of the oscillation signal of the oscillation circuit 100 is lowered. In this case, the oscillation cycle of the oscillation signal is retarded.

Here, with the rising of the temperature, the resistance values R1, R2, R3 of the resistance elements 21, 23, 25 are also raised. As described above, as compared with the resistance elements 21, 25, the resistance element 23 has a smaller regulation of the resistance value relative to the temperature. Therefore, as compared with the increase ratio of the resistance values R1, R3 of the resistance elements 21, 25, the increase ratio of the resistance value R2 of the resistance element 23 is smaller. As a result, as seen from the equations (1) and (2), since the increase of the resistance value R2 is suppressed, the voltage VH becomes lower and the voltage VL becomes higher, as compared with at the ordinary temperature, by a value based on a difference between the regulation of the resistance values for the resistance elements 21, 25 and the regulation of the resistance value for the resistance element 23.

As described above, with the increase of the resistance value of the resistance element 40, the signal of the node N2 reaches the node N1 late. In this case, by lowering the voltage VH and raising the voltage VL, which are compared with the voltage of the node N1 by the comparator 10, the change in the voltage level of the output signal of the comparator 10 can be accelerated. Therefore, even if the temperature rises above the ordinary temperature, the change in the voltage level of the output signal of the comparator 10 can be regulated in the same cycle as at the ordinary temperature. Since the frequency of the oscillation signal of the oscillation circuit 100 fails to lower, the oscillation cycle of the oscillation signal can be stabilized.

Specifically, when a relationship of the resistance value RX of the resistance element 40 and the resistance values R1, R2, R3 of the resistance elements 21, 23, 25 is set so as to satisfy the following equation, the frequency of the oscillation signal fails to fluctuate relative to the temperature.

$$RX(T) \times \log[(R1(T) \times R3(T))/\{(R1(T)+R2(T)) \times (R2(T)+R3(T))\}] = \text{Constant} \ldots \quad (5)$$

In the equation (5), (T) of each element indicates a value in the same temperature state T.

As described above, the oscillation circuit 100 in the first embodiment of the present invention varies the regulation of resistance values of plural resistance elements relative to the temperature, the resistance elements constituting the reference signal generation circuit 20. Therefore, as temperature changes, the voltage of a reference signal input to one input terminal of the comparator 10 can be changed to a voltage different from that at the ordinary temperature. As a result, the oscillation circuit 100 can follow temperature changes to output oscillation signals stable in cycle (or frequency).

Moreover, the oscillation circuit 100 is constituted of a small number of elements such as ones shown in FIG. 1. Therefore, in the first embodiment, the enlargement of the circuit constitution can be reduced.

Furthermore, each resistance element constituting the oscillation circuit 100 requires no special process for its constitution, and can be formed using the well layer or the active layer of the semiconductor substrate necessary in constituting the oscillation circuit 100, or using MOS resistance. Therefore, in the first embodiment, the manufacture process can be prevented from being complicated and the increase of the cost can be minimized.

Additionally, in the same manner as the resistance elements 21, 23, 25, needless to say, the resistance element 40 can be formed in the well layer, active layer or MOS resistance. When the resistance element 40 is formed of the same material as that of the resistance element 23, the regulation of the resistance value of the resistance element 40 relative to the temperature can advantageously be lowered. When the resistance element 40 is constituted of the same material as that of the resistance element 23, the voltage VH or VL is expected to be regulated with a better timing.

Figure 3:
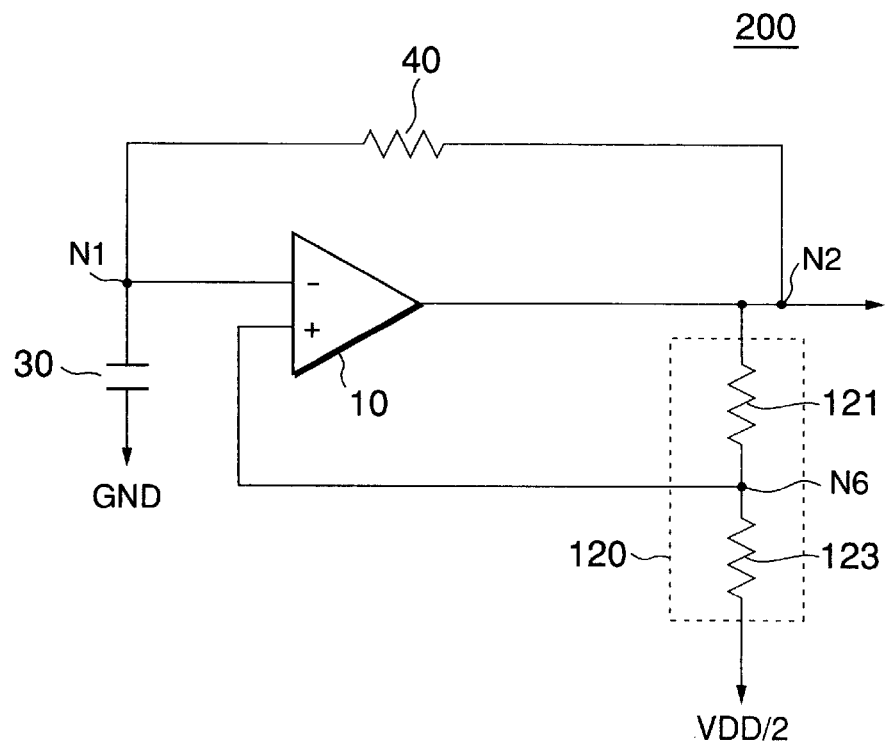
FIG. 3 is a circuit diagram of an oscillation circuit 200 in a second embodiment of the present invention.

Next, an oscillation circuit in a second embodiment will be described with reference to the drawings. FIG. 3 is a circuit diagram of an oscillation circuit 200 in the second embodiment of the present invention. Here, the oscillation circuit 200 is incorporated in a semiconductor device. In FIG. 3, the same portions as those in FIG. 1 are given the same reference numerals to avoid repeated description.

In FIG. 3, the inverters 50, 60 are eliminated from FIG. 1. Therefore, the output signal of the comparator 10 is directly transmitted to the node N2, that is, the output signal of the comparator 10 is output as an oscillation signal of the oscillation circuit 200. It is needless to say that any inverter may be provided for waveform shaping of the signal transmitted to the node N2 so that the output of the inverter can be handled as the oscillation signal.

In FIG. 3, a reference signal generation circuit 120 is provided instead of the reference signal generation circuit 20 of FIG. 1. The reference signal generation circuit 120 differs in circuit constitution from the reference signal generation circuit 20, but the other elements constituting the oscillation circuit 200 in FIG. 3 are the same as those in FIG. 1.

The reference signal generation circuit 120 is constituted of resistance elements 121, 123. One end of the resistance element 121 is supplied with the output signal of the comparator 10, and the other end is connected to a node N6. In the resistance element 123, a voltage VDD/2, which is lower than the power voltage VDD and higher than the ground voltage GND, is applied to one end, with the other end connected to the node N6.

Additionally, for the resistance element 123, as compared with the resistance element 121, the regulation of the resistance value relative to the temperature is smaller. For example, the resistance element 121 is formed in the N-type well layer in the semiconductor substrate in which the oscillation circuit 100 is formed, and the resistance element 123 is formed in the P-type active layer of the high impurity concentration in the semiconductor substrate. Alternatively, the resistance element 121 is formed as MOS resistance using MOS transistor as the resistance, and the resistance element 123 is formed in the P-type active layer of the high impurity concentration in the semiconductor substrate. In this manner, the resistance element 123 is constituted of a material different from that of the resistance element 121, and the resistance element 123 is given a smaller regulation of the resistance value relative to the temperature as compared with the resistance element 121.

Such reference signal generation circuit 120 transmits a signal generated in the node N6 as a reference signal to the plus input terminal of the comparator 10. In the same manner as the first embodiment, a voltage level of the signal generated in the node N6 is set to the voltage VH (when the voltage level of the output signal of the comparator 10 is H level) and to the voltage VL (when the voltage level of the output signal of the comparator 10 is L level) by the voltage of the output signal of the comparator 10. The voltage VH or the voltage VL is subjected to the resistance potential dividing and can be represented in following equations, when a resistance value of the resistance element 121 is R21, and a resistance value of the resistance element 123 is R22:

$$VH = (VDD/2) + (VDD/2) \times \{R22/(R21+R22)\} \ldots \quad (6)$$

$$VL = (VDD/2) \times \{R21/(R21+R22)\} \ldots \quad (7)$$

As shown in the equations (6) and (7), when the voltage supplied to one end of the resistance element 123 is the ground voltage GND, it becomes difficult to set the voltage as the reference signal. Therefore, the voltage is not necessarily limited to the voltage VDD/2 as in the embodiment, but a voltage higher than the ground voltage GND and lower than the power voltage VDD needs to be prepared.

Additionally, as in the embodiment, when the voltage applied to one end of the resistance element 123 is the voltage VDD/2, for example, in a dynamic random access memory or another device using the voltage VDD/2, a new constitution for generating the voltage VDD/2 is not necessary, and the oscillation circuit 200 can be applied. The same can be said in a device to which the voltage VDD/2 is supplied from the outside, or in a device having a circuit for generating the voltage VDD/2 inside.

Next, the operation of the oscillation circuit 200 in the second embodiment will be described hereinafter in detail with reference to the drawings. A change in the voltage level of the node N1 in the oscillation circuit 200 is the same as that of the node N1 of FIG. 2. For a change in the voltage level of the node N2 of the oscillation circuit 200, when the change is regarded as an output obtained via two inverters, it is the same as in the node N2 of FIG. 2.

First, the voltage level of the node N1 is equal to or more than the voltage VL and less than the voltage VH, and the voltage level of the node N2 corresponding to the oscillation signal of the oscillation circuit 200 is H level. In this case, since the output signal of the comparator 10 has a voltage corresponding to the H level, and the node N6 of the reference signal generation circuit 120 has the voltage VH, the voltage applied to the plus input signal of the comparator 10 is based on the voltage VH.

A signal generated in the node N2 and having a voltage level of H level is transmitted to the node N1 via the resistance element 40. The capacitor 30 is charged based on a signal transmitted to the node N1 and having a voltage level of H level. Therefore, the waveform of the voltage of the node N1 is gradually raised as shown in the area C of FIG. 2. The voltage of the node N1 and the voltage VH are compared in the comparator 10.

If the voltage of the node N1 reaches the voltage VH, the comparator 10 detects this, and the voltage level of the output signal of the comparator 10 turns to L level from the H level. With the change in the voltage level of the output signal of the comparator 10, the node N6 of the reference signal generation circuit 120 has the voltage VL. Therefore, the voltage applied to the plus input signal of the comparator 10 is based on the voltage VL.

A signal generated in the node N2 and having a voltage level of L level is transmitted to the node N1 via the resistance element 40. Then, electric charges loaded in the capacitor 30 start to be discharged. Therefore, the waveform of the voltage of the node N1 is gradually lowered as shown in the area D of FIG. 2. The voltage of the node N1 and the voltage VL are compared in the comparator 10.

If the voltage of the node N1 reaches the voltage VL, the comparator 10 detects this, and the voltage level of the output signal of the comparator 10 turns to H level from the L level. With the change in the voltage level of the output signal of the comparator 10, the node N6 of the reference signal generation circuit 120 has the voltage VH. Therefore, the voltage applied to the plus input signal of the comparator 10 is based on the voltage VH.

A signal generated in the node N2 and having the voltage level of H level is transmitted to the node N1 via the resistance element 40. Therefore, the capacitor 30 again starts being charged. Thereby, the waveform of the voltage of the node N1 is again as shown in the area C of FIG. 2.

Thereafter, the oscillation circuit 200 repeats the above-mentioned operation. Therefore, for the waveform of the voltage of the node N1, N2, the H and L levels are repeatedly generated in predetermined cycles as shown in FIG. 2, so that by outputting the signal of the node N2 as the oscillation signal, the oscillation circuit 200 performs an oscillation operation.

Here, when the equations (6) and (7) are substituted in the equation (3), the following results:

$$f=-[1/[2 \times C \times RX \times [\log\{R21/(R21+2 \times R22)\}]]] \ldots \quad (8)$$

As seen from the equation (8), in the same manner as the oscillation circuit 100, the frequency of the oscillation signal of the oscillation circuit 200 is not dependent on the power voltage VDD. Therefore, even if the power voltage VDD fluctuates, the oscillation circuit 200 can obtain an oscillation characteristic in which the frequency of the oscillation signal of the oscillation circuit 200 fails to fluctuate. The oscillation circuit 200 can thus provide the oscillation signal of a frequency stable relative to the fluctuation of the power voltage VDD.

Here, the oscillation circuit 200 in which a temperature change occurs will be described. When the temperature of the environment where the oscillation circuit 200 is operated is lower than the ordinary temperature, the resistance value of the resistance element 40 is lowered as compared with the ordinary temperature. If there is no change in the voltage level of the voltage VL, VH, the signal of the node N2 reaches the node N1 early. Therefore, the equation (8) shows that the frequency of the oscillation signal of the oscillation circuit 200 is increased. In this case, the oscillation cycle of the oscillation signal is accelerated.

Here, with the drop of the temperature, the resistance values R21, R22 of the resistance elements 121, 123 are also lowered. As described above, as compared with the resistance element 121, the resistance element 123 has a smaller regulation of the resistance value relative to the temperature. Therefore, as compared with a decrease ratio of the resistance value R21 of the resistance element 121, the decrease ratio of the resistance value R22 of the resistance element 123 is smaller. As a result, as seen from the equations (6) and (7), since the decrease of the resistance value R22 is suppressed, by a value based on a difference of the regulation of the resistance value for the resistance element 121 and the regulation of the resistance value for the resistance element 123, as compared with at the ordinary temperature, the voltage VH becomes higher, and the voltage VL becomes lower.

As described above, with the decrease of the resistance value of the resistance element 40, the signal of the node N2 reaches the node N1 early. In this case, by increasing the voltage VH, and decreasing the voltage VL, which are compared with the voltage of the node N1 by the comparator 10, the change in the voltage level of the output signal of the comparator 10 can be retarded. Therefore, even if the temperature lowers below the ordinary temperature, the change in the voltage level of the output signal of the comparator 10 is regulated in the same cycle as at the ordinary temperature. Therefore, since the frequency of the oscillation signal of the oscillation circuit 200 fails to be raised, the oscillation cycle of the oscillation signal can be stabilized.

Subsequently, when the temperature becomes higher than the ordinary temperature, the resistance value of the resistance element 40 becomes higher as compared with at the ordinary temperature. If there is no change in the voltage level of the voltage VL, VH, the signal of the node N2 reaches the node N1 late. Therefore, the equation (8) shows that the frequency of the oscillation signal of the oscillation circuit 200 is lowered. In this case, the oscillation cycle of the oscillation signal is retarded.

Here, with the rising of the temperature, the resistance values R21, R22 of the resistance elements 121, 123 are also raised. As described above, as compared with the resistance element 121, the resistance element 123 has a smaller regulation of the resistance value relative to the temperature. Therefore, as compared with the increase ratio of the resistance value R21 of the resistance element 121, the increase ratio of the resistance value R22 of the resistance element 123 is smaller. As a result, as seen from the equations (6) and (7), since the increase of the resistance value R22 is suppressed, by a value based on a difference of the regulation of the resistance value for the resistance element 121 and the regulation of the resistance value for the resistance element 123, as compared with at the ordinary temperature, the voltage VH becomes lower, and the voltage VL becomes higher.

As described above, with the increase of the resistance value of the resistance element 40, the signal of the node N2 reaches the node N1 late. In this case, by lowering the voltage VH, and raising the voltage VL, which are compared with the voltage of the node N1 by the comparator 10, the change in the voltage level of the output signal of the comparator 10 can be accelerated. Therefore, even if the temperature rises above the ordinary temperature, the change in the voltage level of the output signal of the comparator 10 can be regulated in the same cycle as at the ordinary temperature. Since the frequency of the oscillation signal of the oscillation circuit 200 fails to lower, the oscillation cycle of the oscillation signal can be stabilized.

Specifically, when a relationship of the resistance value RX of the resistance element 40 and the resistance values R21, R22 of the resistance elements 121, 123 is set so as to satisfy the following equation, the frequency of the oscillation signal fails to fluctuate relative to the temperature.

$$RX(T) \times \log[R21(T)/(R21(T)+2 \times R22(T))] = \text{Constant} \ldots \quad (9)$$

In the equation (9), (T) of each element indicates a value in the same temperature state T.

As described above, in the same manner as the oscillation circuit 100 in the first embodiment, the oscillation circuit 200 in the second embodiment of the present invention can follow temperature changes to output oscillation signals stable in cycle (or frequency).

Moreover, the oscillation circuit 200 is constituted of less number of elements than the oscillation circuit 100. Therefore, in the second embodiment, the enlargement of the circuit constitution can further be reduced.

Furthermore, in the same manner as the oscillation circuit 100, each resistance element constituting the oscillation circuit 200 requires no special process for its constitution, and can be formed using the well layer or the active layer of the semiconductor substrate necessary in constituting the oscillation circuit 200, or using MOS resistance. Therefore, also in the second embodiment, the manufacture process can be prevented from being complicated and the increase of the cost can be minimized.

Additionally, in the same manner as the resistance elements 121, 123, needless to say, the resistance element 40 can be formed in the well layer, active layer or MOS resistance. When the resistance element 40 is formed of the same material as that of the resistance element 123, the regulation of the resistance value of the resistance element 40 relative to the temperature can advantageously be lowered. When the resistance element .40 is constituted of the same material as that of the resistance element 123, the voltage VH or VL is expected to be regulated with a better timing.

The oscillation circuit of the present invention has been described above in detail, but the present invention is not limited to the above-mentioned embodiment constitutions.

For example, in the reference signal generation circuit the potential dividing is performed with three resistance elements, and in the reference signal generation circuit 120 the potential dividing is performed with two resistance elements, but more resistance elements may be used. Moreover, the conductive polarity of the transistor constituting the oscillation circuit of the present invention may be changed, or the conductive polarity of the layer in the semiconductor substrate constituting the resistance element may be changed.

Furthermore, the signal transmitted to one end of the resistance element 121 may be obtained by transmitting the output signal of the comparator 10 via the inverter, instead of directly transmitting the output signal of the comparator 10.

The constitution of the present invention is not limited to the above-mentioned embodiments, and can be modified to such a degree that the scope of the present invention is not changed.

What is claimed is:

1. An oscillation circuit for outputting an oscillation signal, comprising:
   a comparison circuit comprising a first terminal, a second terminal and an output terminal, wherein said comparison circuit compares a voltage level of a signal input to said first terminal with a voltage level of a reference signal input to said second terminal, and outputs a comparison result as said oscillation signal from said output terminal; and
   a reference signal generation circuit providing said reference signal to said comparison circuit, said reference signal generation circuit comprising at least two resistance means coupled with each other in series, wherein one resistance means is given a smaller regulation of the resistance value relative to the temperature as compared with other resistance means.

2. The oscillation circuit according to claim 1, wherein said one resistance means comprises a material different from a material of said other resistance means.

3. The oscillation circuit according to claim 2, wherein said one resistance means is formed in a first type well layer in a semiconductor substrate and said other resistance means is formed in a second type well layer different from said first type well layer.

4. The oscillation circuit according to claim 2, wherein said one resistance means is formed in an active layer of a high impurity concentration in a semiconductor substrate and said other resistance means is formed with a MOS transistor.

5. An oscillation circuit for outputting an oscillation signal, comprising:
   a comparison circuit comprising a first terminal, a second terminal and an output terminal, wherein said comparison circuit compares a voltage level of a signal input to said first terminal with a voltage level of a reference signal input to said second terminal, and outputs a comparison result as said oscillation signal from said output terminal; and
   a reference signal generation circuit providing said reference signal to said comparison circuit, said reference signal generation circuit comprising at least two resistance means coupled with each other in series, wherein one resistance means is less affected by temperature than another resistance means.

6. The oscillation circuit according to claim 5, wherein said reference signal generation circuit comprises means for selecting between two voltages produced by said at least two resistance means to provide said reference signal.

7. The oscillation circuit according to claim 6, wherein said means for selecting is controlled by said comparison result from said output terminal of said comparison circuit.

8. The oscillation circuit according to claim 6, wherein said means for selecting comprises a pair of MOS transistors of different types.

9. The oscillation circuit according to claim 5, wherein said one resistance means is coupled to a first voltage source having a magnitude greater than ground, and said another resistance means is coupled to a second voltage source having a magnitude greater than said magnitude of said first voltage source.

10. An oscillation circuit for outputting an oscillation signal, comprising:

a first, a second, a third, a fourth and a fifth nodes, wherein said second node outputs said oscillation signal;

a first inverter which has an input terminal and an output terminal;

a second inverter which has an input terminal coupled with said output terminal of said first inverter and an output terminal coupled with said second node;

a comparison circuit which has a first terminal coupled with said first node, a second terminal coupled with said fifth node and output terminal coupled with said input terminal of said first inverter;

a first resistance means which has a first end coupled with said second node and a second end coupled with said first node;

a capacitor which has a first end coupled with said first node and a second end supplied with a first voltage; and a reference signal generation circuit comprising:

a second resistance means which has a first end supplied with a second voltage differing from said first voltage and a second end coupled with said third node;

a third resistance means which has a first end coupled with said third node and a second end coupled with said fourth node;

a fourth resistance means which has a first end coupled with said fourth node and a second node supplied with said first voltage;

a first type MOS transistor which has a control electrode coupled with said output terminal of said first inverter, a first electrode coupled with said third node and a second electrode coupled with said fifth node; and a second type MOS transistor which has a control electrode coupled with said output terminal of said first inverter, a first electrode coupled with said fourth node and a second electrode coupled with said fifth node.

11. An oscillation circuit for outputting an oscillation signal, comprising:

a first, a second, and a sixth nodes, wherein said second node outputs said oscillation signal;

a comparison circuit which has a first terminal coupled with said first node, a second terminal coupled with said sixth node and output terminal coupled with said second node;

a first resistance means which has a first end coupled with said second node and a second end coupled with said first node;

a capacitor which has a first end coupled with said first node and a second end supplied with a first voltage; and a reference signal generation circuit comprising:

a fifth resistance means which has a first end coupled with said second node and a second end coupled with said sixth node; and a sixth resistance means which has a first end coupled with said sixth node and a second end supplied with a third voltage differing from said first voltage.

* * * * *